United States Patent [19]

Goldstein et al.

[11] Patent Number: 5,394,440
[45] Date of Patent: Feb. 28, 1995

[54] HIGH SPEED MODEM SYSTEMS INCORPORATING DISTRIBUTION PRESERVING TOMLINSON ENCODING AND DECODING FOR SECONDARY CHANNELS

[75] Inventors: Yuri Goldstein, Southbury; Paul D. Cole, Fairfield, both of Conn.

[73] Assignee: General DataComm, Inc., Middlebury, Conn.

[21] Appl. No.: 837,490

[22] Filed: Feb. 18, 1992

Related U.S. Application Data

[63] Continuation-in-part of Ser. No. 651,563, Feb. 6, 1991, Pat. No. 5,260,971, which is a continuation-in-part of Ser. No. 820,098, Jan. 13, 1992, Pat. No. 5,291,520.

[51] Int. Cl.⁶ .............................................. H04L 5/12
[52] U.S. Cl. .................................... 375/265; 375/295; 375/340; 370/110.1
[58] Field of Search ...................... 375/39, 7, 8, 94, 59; 370/110.4, 110.1, 111; 332/103; 371/43

[56] References Cited

U.S. PATENT DOCUMENTS

| | | | |
|---|---|---|---|
| 4,535,443 | 2/1985 | Korevaar | 370/24 |
| 4,837,766 | 6/1989 | Yoshida | 371/46 |
| 4,891,806 | 1/1990 | Farias et al. | 370/110 |
| 5,022,053 | 6/1991 | Chung et al. | 375/39 |
| 5,105,443 | 4/1992 | Betts et al. | 370/110.4 |

OTHER PUBLICATIONS

"New Automatic Equaliser Employing Modulo Arithmetic" By M. Tomlinson, Electronics Letters, Mar. 25, 1971, vol. 7, Nos. 5/6.

"Trellis Shaping" by G. David Forney, Jr.; IEEE Information Theory Workshop, CCITT Study Group XVII & Working Parties, Geneva 15–23 Oct. 1990 (Temporary Document 211-E).

"Trellis Precoding: Combined Coding, Precoding and Shaping for Intersymbol Interference Channels"; IEEE Information Theory Workshop, CCITT Study Group XVII & Working Parties, Geneva 15–23 Oct. 1990 (Temporary Document 2112-E).

Primary Examiner—Stephen Chin
Assistant Examiner—Hai H. Phan
Attorney, Agent, or Firm—David P. Gordon

[57] ABSTRACT

Apparatus and methods in both modem transmitters and receivers are provided for accommodating secondary channel data without disturbing the trellis encoding, mapping, and Viterbi decoding of primary channel data, and without disturbing distribution preserving Tomlinson precoding and decoding of the primary channel data. In order to accommodate the secondary channel data, the secondary channel data are used to make quadrant decisions in a mapper, and concurrently therewith, dummy data or tertiary channel data corresponding in time with the secondary channel data are provided to the trellis encoder so that the continuous working of the trellis encoder can be maintained. In order to guarantee proper working of the trellis encoder, and to guarantee reliability of the secondary channel data, the secondary channel constellation points within a quadrant are clustered together and far from the quadrant boundaries, the selected points in each quadrant are the rotations of selected points in the other quadrants, and the points include a single point from each two-dimensional partition element of the 2 D grid in each quadrant. With primary, secondary, and tertiary data encoded in this manner, the encoded data are precoded according to Tomlinson precoding or according to any of several disclosed distribution preserving Tomlinson techniques. Decoding is dictated by the manner in which the primary and secondary data were encoded and precoded.

10 Claims, 7 Drawing Sheets

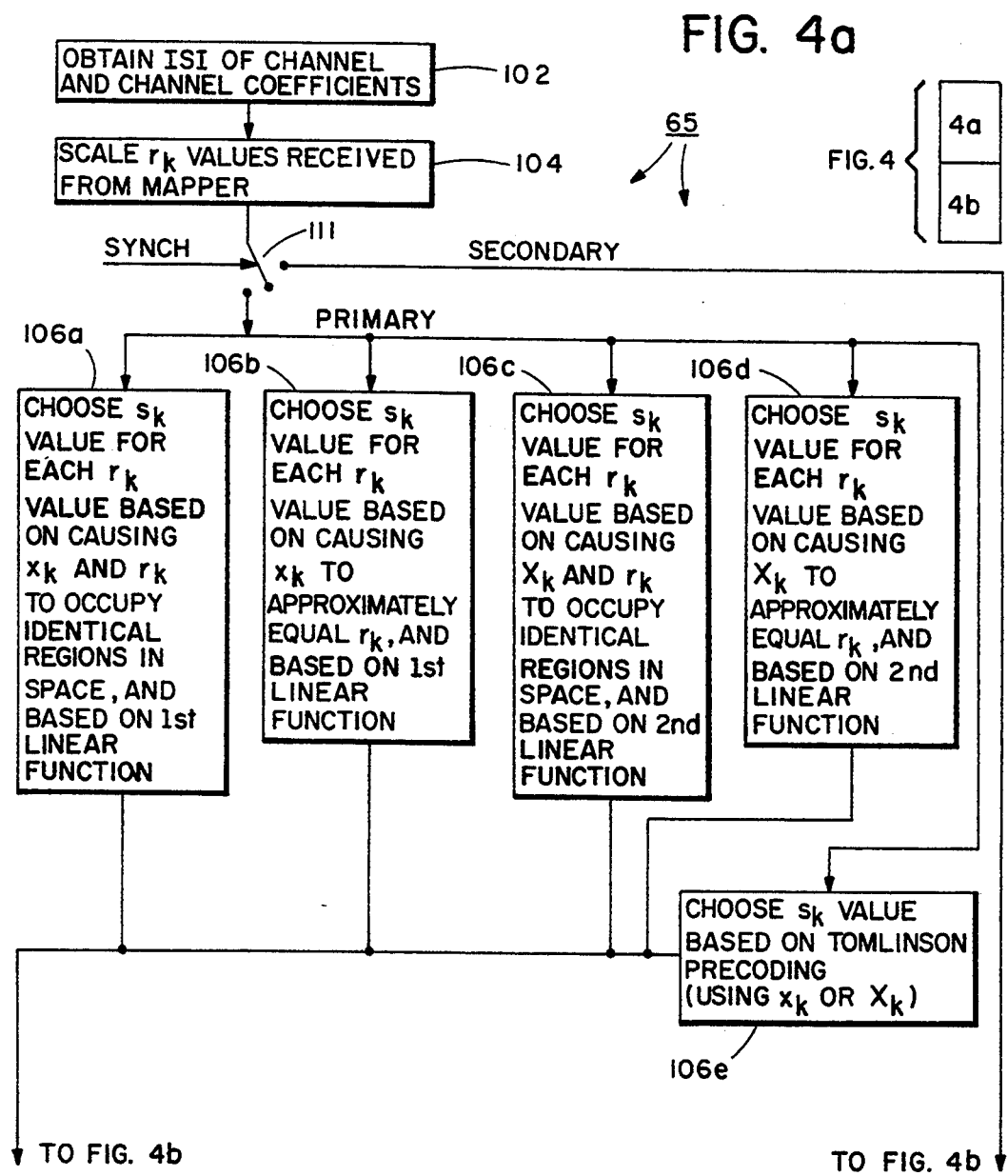

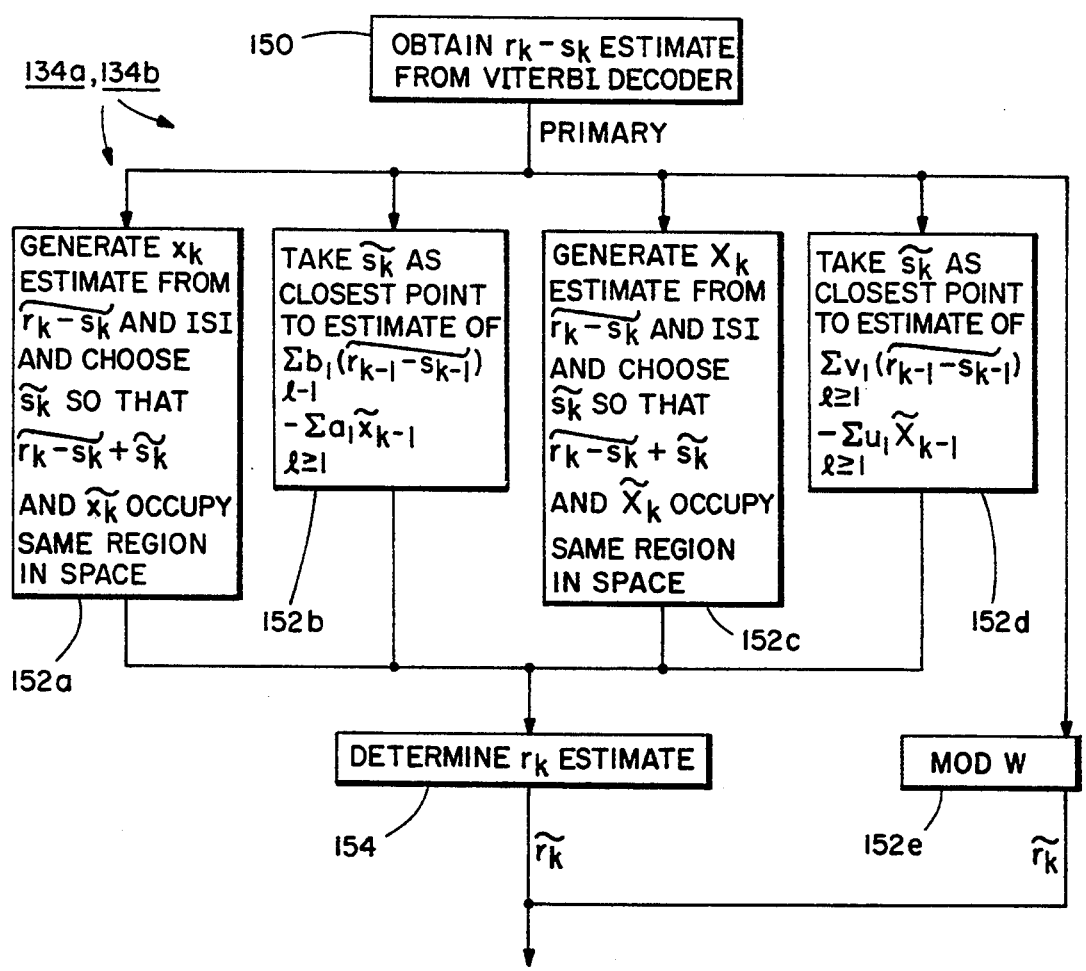
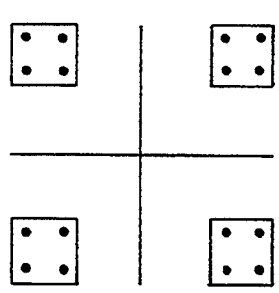
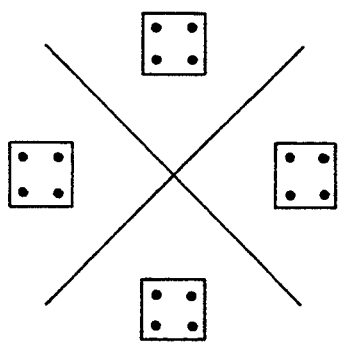

HIGH SPEED MODEM SYSTEMS INCORPORATING DISTRIBUTION PRESERVING TOMLINSON ENCODING AND DECODING FOR SECONDARY CHANNELS

This is a continuation-in-part of Ser. Nos. 07/651,563, filed Feb. 6, 1991, now U.S. Pat. No. 5,260,971, and 07/820,098, filed Jan. 13, 1992, now U.S. Pat. No. 5,291,520, which are hereby incorporated by reference in their entireties herein.

BACKGROUND OF THE INVENTION

1. Field of the Invention

This invention relates broadly to telecommunication systems. More particularly, this invention relates to high speed modems incorporating secondary channels as well as to trellis encoders in the transmitters of such modems and Viterbi decoders in the receivers of such modems.

2. State of the Art

In transmitting data over a channel, it is desirable to code data in manners which will provide as much gain as possible. Various different coding schemes are known in the art. One such coding scheme well known in the art is "trellis encoding". Broadly speaking, trellis encoders are "state machines" which are embodied in the software or firmware of a microprocessor or digital signal processor; i.e., any of a plurality of inputs are given as software inputs to the trellis encoder, and in response thereto and to the state in which the trellis encoder is presently situated, the trellis encoder provides a particular output and updates its state. Typically, the manner in which the trellis encoder decides the appropriate output and the state into which it is updated is by reference to a look-up table (often embodied in firmware) which has the input and present state as inputs and the output and new state as outputs. Details of trellis encoders may be seen with reference to U.S. Pat. No. 4,713,817 to Wei, and with reference to A. R. Calderbank and N. J. A. Sloane, "New Trellis Codes Based on Lattices and Cosets": *IEEE Trans. Inform. Theory*; Vol. IT-33, pp. 177–195 (1987).

Recently, in U.S. Pat. No. 4,891,806 to Farias et al., it was proposed that a modem include a secondary channel for diagnostic and/or other purposes. The prior art modem system as generally proposed is set forth in the prior art FIG. 1. There it is seen that the primary channel data 12 are inserted into a trellis encoder 13 and a mapper 14 of modem 15. The encoded data 16 are then multiplexed by a multiplexer or switch 18 with data from the secondary channel 20 which was also mapped by mapper 14. The multiplexed data are then sent over a line 25. On the receiving side, the multiplexed data stream is demultiplexed by a demultiplexer or switch 28, and the primary channel data 30 are fed into a Viterbi decoder 32 of modem 35 for decoding, while the secondary channel data stream 37 is decoded by a quadrant decoder 39 separately. According to the prior art disclosure, the secondary data are transmitted every forty-ninth frame, and the primary data channel output of the trellis encoder/mapper 14 is stopped every forty-ninth frame to permit the insertion into the data stream of the secondary data channel output of mapper 14. Such an arrangement not only undesirably requires the stopping and starting of the trellis encoder, but also does not admit of the "distribution preserving Tomlinson" (DPT) encoding and decoding advances set forth in the aforementioned parent applications hereto. In particular, assuming the simplest possible non-trivial channel polynomial $h(D)=1+h_1(D)$ with no other impairments, the channel's response to the transmitted sequence $\{x_k\}$ at discrete time k is $x_k+h_1 x_{k-1}$. Now, assuming that the secondary channel data is multiplexed into the data stream after the DPT encoding of the primary data; i.e., instead of transmitting $\{x_k\}$, another sequence $\{w_m\}$ is interleaved (e.g., every third baud) with $\{x_k\}$, then the transmitted sequence would be:

$$\ldots 0, 0, 0, x_0, x_1, w_0, x_2, x_3, w_1, x_4, \ldots$$

Then, the channel's response to $w_0$ is $w_0+h_1 x_1$, while the channel's response to $x_2$ is $x_2+h_1 w_0$; neither response being what would be desired or anticipated by the precoder.

SUMMARY OF THE INVENTION

It is therefore an object of the invention to provide apparatus and methods for accommodating a secondary channel while precoding primary channel data according to a distribution a preserving Tomlinson method.

It is another object of the invention to provide apparatus and methods for accommodating a secondary channel without disturbing the trellis encoding and mapping, and the decoding of the primary channel data.

It is a further object of the invention to provide apparatus and methods in both modem encoders and decoders for accommodating a secondary channel without disturbing the trellis encoding, mapping, and Viterbi decoding, and without disturbing distribution preserving Tomlinson precoding and decoding.

In accord with the objects of the invention, and in accord with the preferred embodiment, the primary channel data are encoded in manners known in the art where some bits of a plurality of the primary channel data bits are sent to a trellis encoder, and the remainder of the plurality of primary channel data bits together with the output of the trellis encoder are sent to a mapper in order to choose a sequence of points of a typically two-, four-, or eight-dimensional constellation. In the mapper, the primary channel data are preferably shaped according techniques such as set forth in U.S. Pat. No. 5,048,056 to Goldstein and Ser. No. 07/640,260 to Goldstein which are both hereby incorporated by reference herein in their entireties. The treatment of the secondary channel data, on the other hand, is different than previously known in the art. For the secondary channel data, the secondary channel bits are sent to the mapper in order to choose a quadrant of a preferably two dimensional constellation, while additional bits (either tertiary channel bits, or any value bits) are fed into the trellis encoder so that the trellis encoder can update its state and provide an output in conjunction with the secondary channel data to choose a point in the quadrant of the two dimensional constellation. In this manner, the trellis encoder continues in an uninterrupted manner while the output of the mapper is a multiplexed valid coded sequence $\{r_k\}$.

For the mapping of the secondary channel data, the two dimensional constellation in the mapper for the secondary channel data is divided into quadrants by a pair of perpendicular lines through the origin, and points from the 2 D grid defined by the primary constellation are selected as possible secondary channel points for each quadrant. In order to gain reliability, the selected points within a quadrant are preferably clustered together and far from the quadrant boundaries. Also, in order to be rotationally invariant, the selected points in each quadrant are the rotations of the selected points in the other quadrants. Further, because the trellis code is preferably based on the partitioning of the two-dimensional grid defined by the two-dimensional constellation into two-dimensional partition elements, a single point from each two-dimensional partition element is preferably included in each quadrant to guarantee the continuity of the trellis encoding. Thus, in each quadrant, and regardless of the state that the trellis encoder is in, a valid point is available for transmission.

After shaping, the primary channel data may be precoded according to standard Tomlinson precoding techniques, but are preferably precoded by any one of the four distribution preserving Tomlinson techniques disclosed in parent applications Ser. Nos. 07/651,563 and 07/820,098. In particular, predistortion may be accomplished according to a linear function $$x_k + \sum_{l \geq 1} a_l x_{k-1} = r_k - s_k + \sum_{l \geq 1} b_l(r_{k-1} - s_{k-1}) \quad (1)$$

where $r_k$ is a data signal entering the precoding means, $a_1$ and $b_1$ are the coefficients of polynomials relating to the channel impulse response, $x_k$ is the predistorted data signal exiting the precoding means, and $s_k$ is chosen to cause the signal power of $x_k$ on average to approximately equal the signal power of $r_k$ on average. According to a first DPT technique, in choosing $s_k$ as defined, $s_k$ may be chosen as a multiple of a given value (N) which is chosen to cause $x_k$ and $r_k$ to occupy identical defined regions in space, where the total length and/or width of each defined region is the given value N. According to a second DPT technique, $s_k$ may be chosen to cause $x_k$ to approximate $r_k$ (i.e. $s_k$ chosen closest to $$\sum_{l \geq 1} b_l(r_{k-1} - s_{k-1}) - \sum_{l \geq 1} a_l x_{k-1}).$$

In accord with the third and forth DPT techniques, $s_k$ may be chosen at the transmitter according to a second linear function:

$$X_k + \sum_{l \geq 1} u_l X_{k-1} = r_k - s_k + \sum_{l \geq 1} v_l(r_{k-1} - s_{k-1}) \quad (2)$$

where $r_k$ is a data signal entering the precoding means, $X_k$ is an approximator of $x_k$, $u_1$ and $v_1$ are the coefficients of polynomials chosen such that $X_k$ is an approximator of $X_k$, and $s_k$ is chosen to cause the signal power of $X_k$ on average to approximately equal the signal power of $r_k$ on average. Typically, the coefficients $u_1$ are set to zero. Where $s_k$ is chosen according to equation (2), it will be appreciated that upon sending a signal, predistortion itself is still accomplished according to equation (1). It should also be appreciated in using the approximation linear function (2) in choosing $s_k$, that $s_k$ may still be chosen as a multiple of a given value N chosen to cause $X_k$ and $r_k$ to occupy identical defined regions in space (i.e., the third DPT technique), or to cause $X_k$ to approximate $r_k$ (i.e., $s_k$ chosen closet to $$\sum_{l \geq 1} v_l(r_{k-1} - s_{k-1}) - \sum_{l \geq 1} u_l X_{k-1})$$

(i.e., the fourth DPT technique).

If the primary channel data are subjected to shaping and distribution preserving Tomlinson precoding as preferred, after mapping, the secondary channel data are treated differently than the primary channel data. Thus, in the transmitting modem, the secondary channel data are tracked, and in the preferred embodiment, after mapping, the secondary channel data are precoded according to the standard Tomlinson techniques. According to another embodiment, after mapping, the secondary channel data which are tracked are precoded according to a modification of any of the above-summarized DPT techniques. In the modified DPT technique, in the precoding, $x_k$ or $X_k$ must be selected to be in the same quadrant as $r_k$. Regardless, the same hardware is preferably used, and only the precoding software changes for the respective channels.

At the receiver, and in accord with the preferred embodiment, when the primary data channel has been encoded with a trellis encoder, mapped, and precoded according to a distribution preserving Tomlinson technique, and where the secondary data have been mapped and precoded according to the standard Tomlinson precoding, the primary channel data are sent through a Viterbi decoder as known in the art, and then through a distribution preserving Tomlinson decoder as disclosed in the parent applications hereto. The secondary (and tertiary) channel data, are also sent through the Viterbi decoder and the DPT decoder so that both decoders may function properly. However, at the primary channel data output of the DPT decoder, the outputs corresponding to the tracked secondary channel data are discarded. While the secondary channel data are being sent through the Viterbi and DPT decoders, at the same time, they are also treated separately. In particular, the secondary channel data may be obtained before the Viterbi decoder, and if so, the secondary channel data is sent through a standard Tomlinson decoder (mod W), and then through a quadrant decision decoder to provide the secondary channel data. Alternatively, the secondary channel data may be sent through the Viterbi decoder and then broken out and sent through a standard Tomlinson decoder (mod W), and then sent through a quadrant decision to provide the secondary channel data. The second possibility provides for the inclusion of a tertiary channel which is as reliable as the primary channel. As a third possibility, the secondary channel data are sent through both the Viterbi decoder and through an augmented DPT decoder. In the augmented DPT decoder, when the primary channel data are received, the techniques described in the above-referenced parent patent applications are used, and when the secondary channel data are received, the DPT decoder uses standard Tomlinson decoding (mod W) or a modified DPT decoding algorithm. The decoded secondary channel data are then sent for a quadrant decision to yield a decision regarding the secondary channel data. The output of the augmented DPT decoder is switched to provide the primary channel data when the primary channel data are being decoded, and the secondary channel data when the secondary channel data are being decoded. Regardless of which of the above-summarized possibilities are used, the primary channel outputs of the decoder are demapped in a demapper. Where a tertiary channel is involved, a tertiary channel demapper is also used.

At the decoder, when the primary data have been encoded with a trellis encoder, mapped, and precoded according to a distribution preserving Tomlinson technique, and where the secondary data have been mapped and precoded according to the modified distribution preserving Tomlinson precoding (i.e., $x_k$ or $X_k$ must be selected to be in the same quadrant as $r_k$), both the primary and secondary channel data are sent to the Viterbi decoder and then to an augmented DPT decoder. In the augmented DPT decoder, when the primary channel data are received, the techniques described in the above-referenced parent patent applications are used, and when the secondary channel data are received, a modified DPT decoding technique is used. In the modified DPT decoding technique, the normal DPT decoding operations of finding regions or closest points are not used; rather, all that is found is the chosen quadrant by computing the estimates $\bar{X}_k$ or $\tilde{X}_k$ (based on what was done in the transmitter). The output of the augmented DPT decoder is then switched to provide the primary channel data when the primary channel data are being decoded, and the secondary channel data when the secondary channel data are being decoded.

When the primary channel data are not subjected to DPT, but instead are precoded according to Tomlinson precoding, at the receiver, both the primary and secondary channel data are decoded by a Viterbi decoder and then further decoded by a standard Tomlinson decoder. At the output of the Tomlinson decoder, the primary and secondary channel data are demuxed.

Additional objects and advantages of the invention will become apparent to those skilled in the art upon reference to the detailed description taken in conjunction with the provided figures.

BRIEF DESCRIPTION OF THE DRAWINGS

FIG. 4a and 4b is a flow diagram of the precoder of the invention showing choices of distribution preserving Tomlinson techniques and the Tomlinson precoding technique for each of the primary and secondary channel data.

FIG. 6-1 is a flow diagram of the decoder of the receiver apparatus of FIGS. 5a and 5b.

FIG. 6-2 is a flow diagram of the decoder of the receiver apparatus of FIG. 5c.

FIGS. 7a and 7b are examples of regions containing the constellation points for the secondary channel where distribution preserving Tomlinson techniques utilizing regions are used for the secondary channel.

DETAILED DESCRIPTION OF THE PREFERRED EMBODIMENTS

Figure 2:
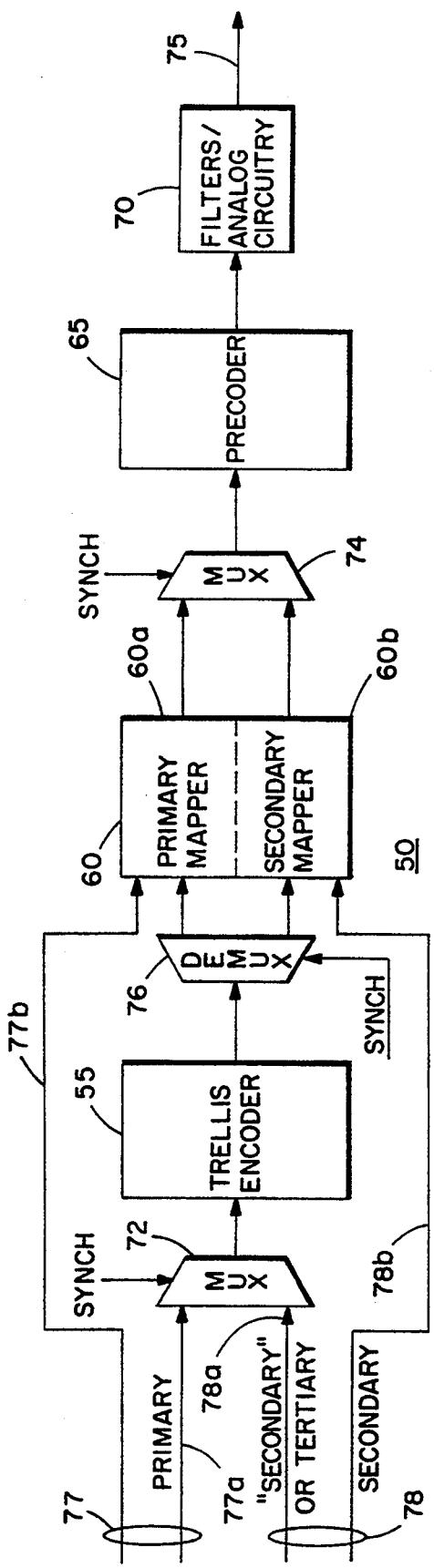
FIG. 2 is a block diagram of the transmitter apparatus of the invention.

Turning to FIG. 2, part of the encoder and precoder apparatus of the modem transmitter 50 of the invention is seen. As will be appreciated by those skilled in the art, the modem transmitter is substantially embodied in a microprocessor or digital signal processor and accompanying circuitry. As shown in FIG. 2, the transmitter 50 includes a trellis encoder 55, a mapper 60, a precoder 65, and filters and analog circuitry 70. Also included are two multiplexers 72, 74, and a demultiplexer 76. The inputs to the trellis encoder 55 are data from both primary and secondary data channels 77, 78. The data from the primary data channel is data such as is taught by Wei in U.S. Pat. No. 4,713,817, such that typically a first plurality of bits 77a are sent to the trellis encoder 55 and therefrom (via demultiplexer 76) to the mapper 60a, and a second plurality of bits 77b are sent directly to the mapper 60a in order to choose a sequence of points of a typically two-, four-, or eight-dimensional constellation. In the mapper 60a, the primary channel data are preferably shaped according techniques such as set forth in previously incorporated U.S. Pat. No. 5,048,056 and Ser. No. 07/640,260. Of course, shaping is preferred and not required.

The data from the secondary channel which are input to the trellis encoder 55 are data which is partially taught in U.S. Pat. No. 4,891,806 assigned to Racal DataComm, Inc.; i.e., the secondary channel data are shown as a plurality of bits 78b which are fed directly to a secondary mapper 60b which is part of mapper 60 as hereinafter described. In accord with the invention, however, along with the secondary channel data 78b, an input 78a related to the secondary channel (or representing tertiary channel data) must be presented to the trellis encoder 55. The input data 78a may be "dummy" data, or in the case of a tertiary channel, may represent actual information. Regardless, based on a synchronous timing schedule (e.g, using a counter, clock, etc., as is well known in the art such as in U.S. Pat. No. 4,891,806 with the "synch" representing the secondary channel frame), the primary channel data 77a and the secondary channel dummy data or tertiary channel data 78a are multiplexed serially in time (i.e., switched) by multiplexer 74 for input to the trellis encoder 55. This dummy data or tertiary channel data 78a permits the trellis encoder to update its state and provide an output (via time division demultiplexer 76) in conjunction with the secondary channel data for use by the secondary mapper 60b. In this manner, the trellis encoder continues in an uninterrupted manner while the output of the mapper is a multiplexed (by multiplexer 74) valid coded sequence $\{r_k\}$.

In order to guarantee that the output of mapper 60 is a valid coded sequence $\{r_k\}$, the two-dimensional (2 D) constellation for the secondary channel data must be constituted from points which are drawn from the same points from which the 2 D constellation used for the primary channel data is obtained. Preferably, the 2 D constellation comes from a 2D grid as taught and shown in Wei U.S. Pat. No. 4,713,817 and Goldstein U.S. Pat. No. 5,048,056 and Ser. No. 07/640,260, and the 2 D constellation for the secondary channel data is a subset of the same 2 D grid.

Figure 3B:
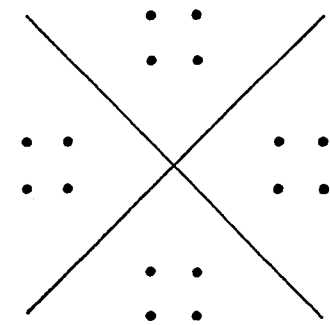
FIGS. 3a and 3b are examples of two different two-dimensional constellations for the encoding of secondary channel data in accord with the invention.
Figure 3A:
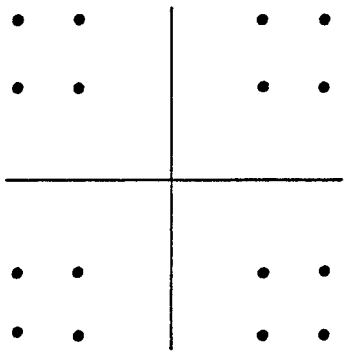

Turning to FIGS. 3a and 3b, two preferred 2 D constellations for the secondary channel data are seen. As seen in FIGS. 3a and 3b, the 2 D constellation in the mapper for the secondary channel data is divided into quadrants by a pair of perpendicular lines through the origin, and points from the 2 D grid defined by the primary constellation are selected as possible secondary channel points for each quadrant. In order to gain reliability, the selected points within a quadrant are preferably clustered together and are far from the quadrant boundaries (as seen in FIGS. 3a and 3b). Also, in order to be rotationally invariant, the selected points in each quadrant are the rotations of selected points in the other quadrants, again as seen in FIGS. 3a and 3b. Further, because the trellis code is preferably based on the partitioning of the 2 D grid into two-dimensional partition elements, a single point from each two-dimensional partition element is preferably included in each quadrant to guarantee the continuity of the trellis encoding.

Thus, in each quadrant, and regardless of the state that the trellis encoder is in, a valid point is available for transmission. For the constellations of FIGS. 3a and 3b, it will be appreciated that the 2 D grid was divided into four 2 D partition elements. Where the 2 D grid is divided into eight 2 D partition elements, eight points are preferably utilized in each quadrant.

Returning to FIG. 2, the valid coded sequence $\{r_k\}$ which is generated by multiplexing at multiplexer 74 the outputs of the mapper 60 is sent to the precoder 65. After precoding, as hereinafter described, the precoded data are sent to filters and analog circuitry 70 for output onto the line 75.

Figure 4B:
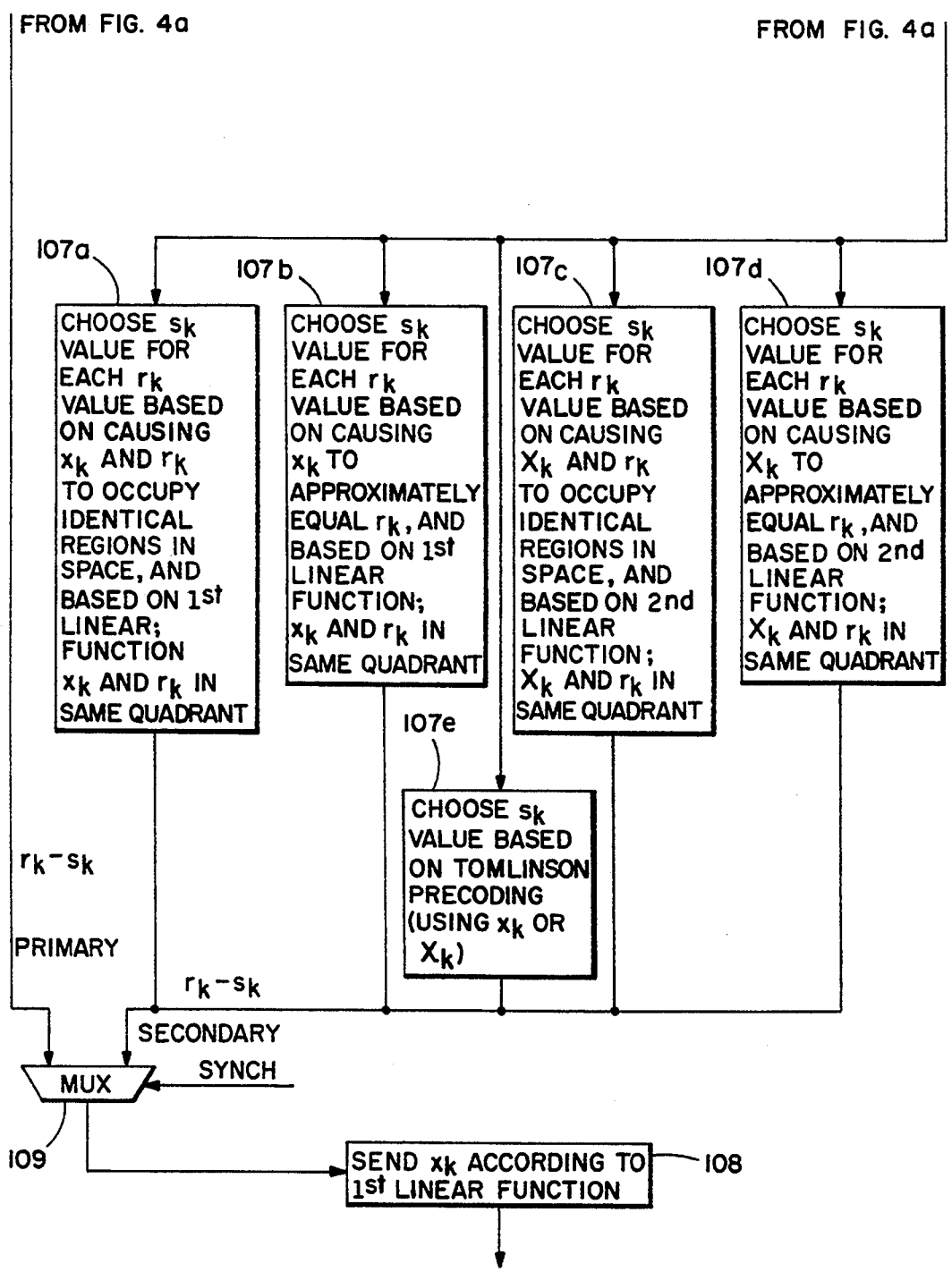

Details of the preferred precoder 65 are seen with reference to FIG. 4. As aforementioned, the precoder is preferably embodied in a digital signal processor, microprocessor, or other processing means. The programming of the processing means is seen in FIG. 4 where at step 102, the ISI of the channel and the channel coefficients are obtained. Then at step 104, the valid coded sequence $\{r_k\}$ received from the mapper is scaled, if necessary. Then, regardless of whether the primary channel data or secondary channel data are being precoded, the $r_k$ values are submitted in received order to the same hardware means for precoding so that the same memory locations for values of interest are used (although different precoding algorithms might be used). As seen in FIG. 4, for the primary channel data, the means for precoding precodes according to either standard Tomlinson precoding technique (106e), or more preferably, according to any one of the four distribution preserving Tomlinson (DPT) techniques 106a–106d disclosed in parent applications Ser. Nos. 07/651,563 and 07/820,098. In particular, predistortion may be accomplished according to a linear function $$x_k + \sum_{l \geq 1} a_l x_{k-1} = r_k - s_k + \sum_{l \geq 1} b_l(r_{k-1} - s_{k-1}) \quad (1)$$

where $r_k$ is a data signal entering the precoding means, $a_1$ and $b_1$ are the coefficients of polynomials relating to the channel impulse response, $x_k$ is the predistorted data signal exiting the precoding means, and $s_k$ is chosen to cause the signal power of $x_k$ on average to approximately equal the signal power of $r_k$ on average. According to a first DPT technique (106a), in choosing $s_k$ as defined, $s_k$ may be chosen as a multiple of a given value (N) which is chosen to cause $x_k$ and $r_k$ to occupy identical defined regions in space, where the total length and/or width of each defined region is the given value N. According to a second DPT technique (106b), $s_k$ may be chosen to cause $x_k$ to approximate $r_k$ (i.e., $s_k$ chosen closest to $$\sum_{l \geq 1} b_l(r_{k-1} - s_{k-1}) - \sum_{l \geq 1} a_l x_{k-1}).$$

In accord with the third and fourth DPT techniques (106c and 106d), $s_k$ may be chosen at the transmitter according to a second linear function:

$$X_k + \sum_{l \geq 1} u_l X_{k-1} = r_k - s_k + \sum_{l \geq 1} v_l(r_{k-1} - s_{k-1}) \quad (2)$$

where $r_k$ is a data signal entering the precoding means, $X_k$ is an approximator of $x_k$, $u_1$ and $v_1$ are the coefficients of polynomials chosen such that $X_k$ is an approximator of $X_k$, and $s_k$ is chosen to cause the signal power of $X_k$ on average to approximately equal the signal power of $r_k$ on average. Typically, the coefficients $u_1$ are set to zero. Where $s_k$ is chosen according to equation (2), it will be appreciated that upon sending a signal, predistortion itself is still accomplished according to equation (1). It should also be appreciated in using the approximation linear function (2) in choosing $s_k$, that $s_k$ may still be chosen as a multiple of a given value N chosen to cause $X_k$ and $r_k$ to occupy identical defined regions in space (i.e., the third DPT technique), or to cause $X_k$ to approximate $r_k$ (i.e., $s_k$ chosen closest to $$\sum_{l \geq 1} v_l(r_{k-1} - s_{k-1}) - \sum_{l \geq 1} u_l X_{k-1})$$

(i.e., the fourth DPT technique). Additional detail regarding each of these four DPT techniques may be gained by reference to the previously incorporated parent application hereto.

If the Tomlinson precoding is used at 106e, $s_k$ is selected so that $x_k$ or $X_k$ lies in a fundamental region (e.g., a square) for the multiples of W in the plane, where W is chosen such that the trellis code is insensitive to translations by multiples of W in the plane (i.e., the $s_k$'s are multiples of W), and such that a square of side W centered at the origin contains the constellation used for the primary channel data. Additional detail regarding Tomlinson precoding may be gained by reference to M. Tomlinson, "New Automatic Equalizer Employing Modulo Arithmetic"; *Electronics Letters Vol. 7*, (March, 1971) pp. 138–139.

Returning to FIG. 4, when the encoded secondary channel data (and tertiary channel data) are to be precoded (as determined by some synch signal), a switch 111 (e.g., a software switch) is thrown. The secondary channel data may then be precoded according either according to any of four modified DPT techniques 107a–107d, or more preferably according to Tomlinson precoding 107e. If the Tomlinson precoding is used at 107e for the encoded secondary channel data, $s_k$ is selected so that $x_k$ or $X_k$ lies in a fundamental region (e.g., a square) for the multiples of W in the plane, where W is chosen such that the trellis code is insensitive to translations by multiples of W in the plane (i.e., the $s_k$'s are multiples of W), and such that a square of side W centered at the origin contains the constellation used for the secondary channel data. In addition, W must be chosen such that upon translation of the points of the primary constellation by multiples of W, the translated points are no closer to the original points than the original points are to each other. On the other hand, if one of the modified DPT techniques are used, the same schemes for choosing $s_k$ as disclosed above with reference to the encoded primary channel are used, except that care must be taken to ensure that $x_k$ or $X_k$ is selected to be in the same quadrant as $r_k$. In particular, if the DPT techniques using regions (107a, 107c) are employed, the regions utilized are preferably squares such as seen in FIGS. 7a and 7b, with each square being located far from both boundaries of the quadrant in which it is contained.

Returning again to FIG. 4, once the $r_k$–$s_k$ values are determined for the primary and secondary (and tertiary) channel data, they are multiplexed by multiplexer 109 into a steady stream and at 108 $x_k$ is chosen according to the linear function set forth as equation (1) above. The $x_k$ values are then sent to the filters and analog circuitry 70 as aforedescribed with reference to FIG. 2.

Figure 5A:
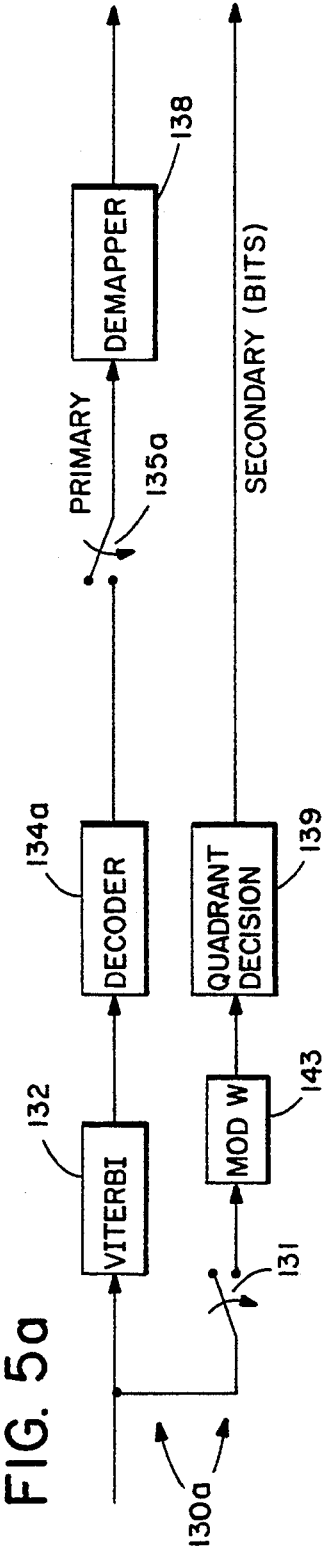
FIGS. 5a–5c are block diagrams of three embodiments of the receiver apparatus of the invention.
Figure 5B:
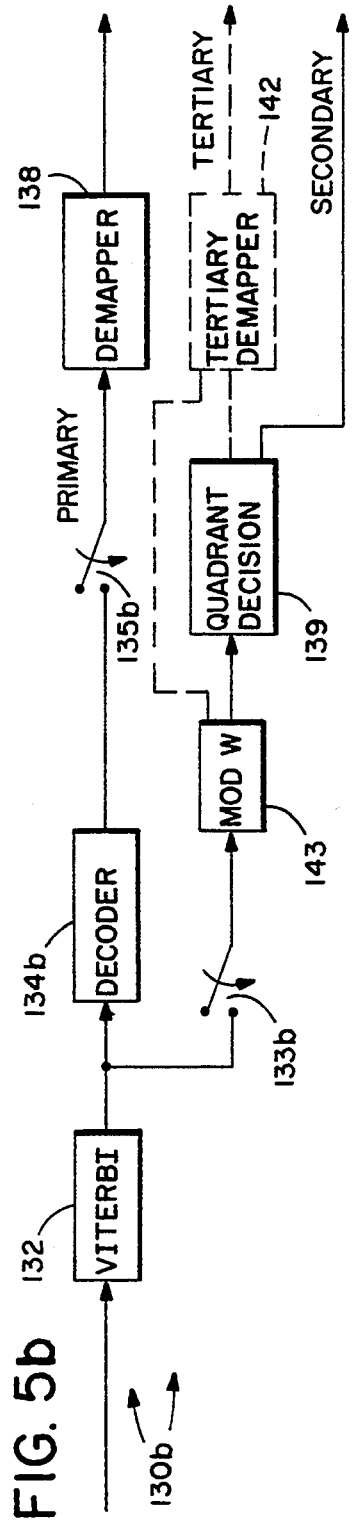
Figure 5C:
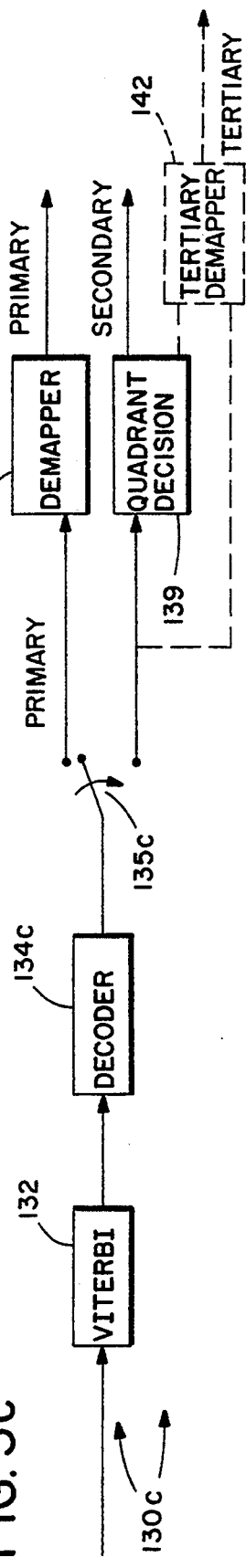

Turning to FIGS. 5a–5c, different decoding schemes for a modem receiver 130 are seen. The modem receivers 130a and 130b of FIGS. 5a and 5b apply to the embodiments of the invention where the primary channel data were precoded according to Tomlinson precoding or any of the four DPT precoding techniques, and where the secondary channel data were precoded according Tomlinson precoding. On the other hand, the modem receiver 130c of FIG. 5c applies to the embodiment of the invention where the primary channel data were precoded according to the Tomlinson precoding or any of the four DPT precoding techniques, and the secondary channel data were also precoded according to the Tomlinson precoding or any of the four DPT precoding techniques. Regardless of which precoding techniques were used for the primary and secondary channel data, the primary channel data are treated essentially identically in each of the schemes represented by FIGS. 5a, 5b, and 5c; and the secondary channel data are treated differently in each scheme. In particular, in all three schemes, a corrupted version (corrupted due to noise and other line impairments) of the encoded, precoded multiplexed data sent by the transmitting modem is received by a Viterbi decoder 132. The Viterbi decoder 132 takes that data, and provides an output ($\widetilde{r_k - s_k}$) to the decoder 134, where the estimate $\widetilde{r_k - s_k}$ is a point on the grid from which the primary and secondary channel constellation points are taken. The decoders 134a, 134b, 134c of FIGS. 5a, 5b, and 5c decode the information received from the Viterbi decoder in a manner exactly corresponding to the manner in which the primary channel data was originally encoded as discussed in more detail with reference to FIG. 6-1. While the secondary channel data are used by the decoders 134a, 134b, and 134c in determining what primary data were sent (as decoders 134a, 134b, and 134c require information from previously received values), in the arrangements of FIGS. 5a and 5b, the outputs of the decoder corresponding to the secondary channel data frame, if generated, are discarded via use of timed switches 135a, and 135b, and only the primary channel data is forwarded to the primary data demapper 138 for a final decision regarding the primary channel data values. In FIG. 5c, as will be discussed in more detail with reference to FIG. 6-2, since the output of decoder 134c effectively provides decisions regarding the primary and secondary (and tertiary) channel data, switch 135c is used to switch the primary channel data to the primary channel demapper 138, and the secondary channel (and tertiary channel) data to the quadrant decision means 139 and tertiary demapper 142.

While the primary channel data are treated essentially identically in FIGS. 5a–5c, as aforementioned, the secondary channel data are treated differently. Thus, in accord with the embodiment of FIG. 5a, where the primary channel data were preceded according to either Tomlinson preceding or any of the four DPT preceding schemes, but the secondary channel data were preceded using Tomlinson, a copy of the secondary channel data is taken via timed switch 131a before decoding by the Viterbi decoder 132. This corrupted, encoded, preceded secondary channel data is then fed to a Tomlinson decoder 143 where it is reduced modulo W to provide a corrupted version of $r_k$. The output of the Tomlinson decoder 143 is then fed to a quadrant decision means 139 where a decision is made as to in which quadrant the corrupted version of $r_k$ is found. Hence, the secondary data that were sent is recovered.

In the embodiment of FIG. 5b, where again the primary channel data were precoded according to either Tomlinson precoding or any of the four DPT precoding schemes, and again, the secondary channel data were precoded using Tomlinson precoding, the secondary channel data (and tertiary channel data if used) are sent through the Viterbi decoder 132 where an estimate of $r_k - s_k$ is made; the estimate being a point in the same grid as the constellations of the primary and secondary channels. At the output of the Viterbi decoder, a copy of the secondary channel data is taken via timed switch 133b and fed to the Tomlinson decoder 143 where the estimate of $r_k - s_k$ is reduced modulo W to provide an estimate of $r_k$. The estimate output of the Tomlinson decoder 143 is provided to the quadrant decision means 139 where a decision is made as to in which quadrant the estimate of $r_k$ is found. Hence, the secondary data that were sent is recovered. The output of the quadrant decision means 139, together with the the output of the Tomlinson decoder 143 may also be used as inputs to a tertiary demapper 142 so that a decision can be made regarding the tertiary data if tertiary data were sent.

Turning to FIG. 5c, where the primary channel data were precoded according to either Tomlinson precoding or any of the four DPT precoding schemes, and the secondary channel data were precoded using either Tomlinson precoding or any of the four DPT precoding schemes, the secondary channel data (and tertiary channel data if used) are sent through the Viterbi decoder 132 where an estimate of $r_k - s_k$ is made. The estimate is fed to decoder 134c where, as will be discussed in more detail hereinafter with reference to FIG. 6-2, if the precoding of the secondary channel data was via the use of Tomlinson precoding, the decoder 134c reduces the estimate modulo W to provide an estimate value $\widetilde{r_k}$; and if the precoding of the secondary channel data was via any of the DPT precoding schemes, the decoder 134c computes an estimate value $\widetilde{x_k}$ or $\widetilde{X_k}$ depending upon the DPT precoding scheme. Regardless of which estimate is output from the decoder 134c, the output of the decoder 134c is fed to the quadrant decision means 139 where a decision is made as to in which quadrant the submitted point is found. Hence, the secondary data that were sent are recovered. The output of the quadrant decision means 139, together with the the output $\widetilde{r_k - s_k})$ of the Viterbi decoder means may also be used as inputs to a tertiary demapper 142 so;that a decision can be made regarding the tertiary data if tertiary data were sent.

Figure 1:
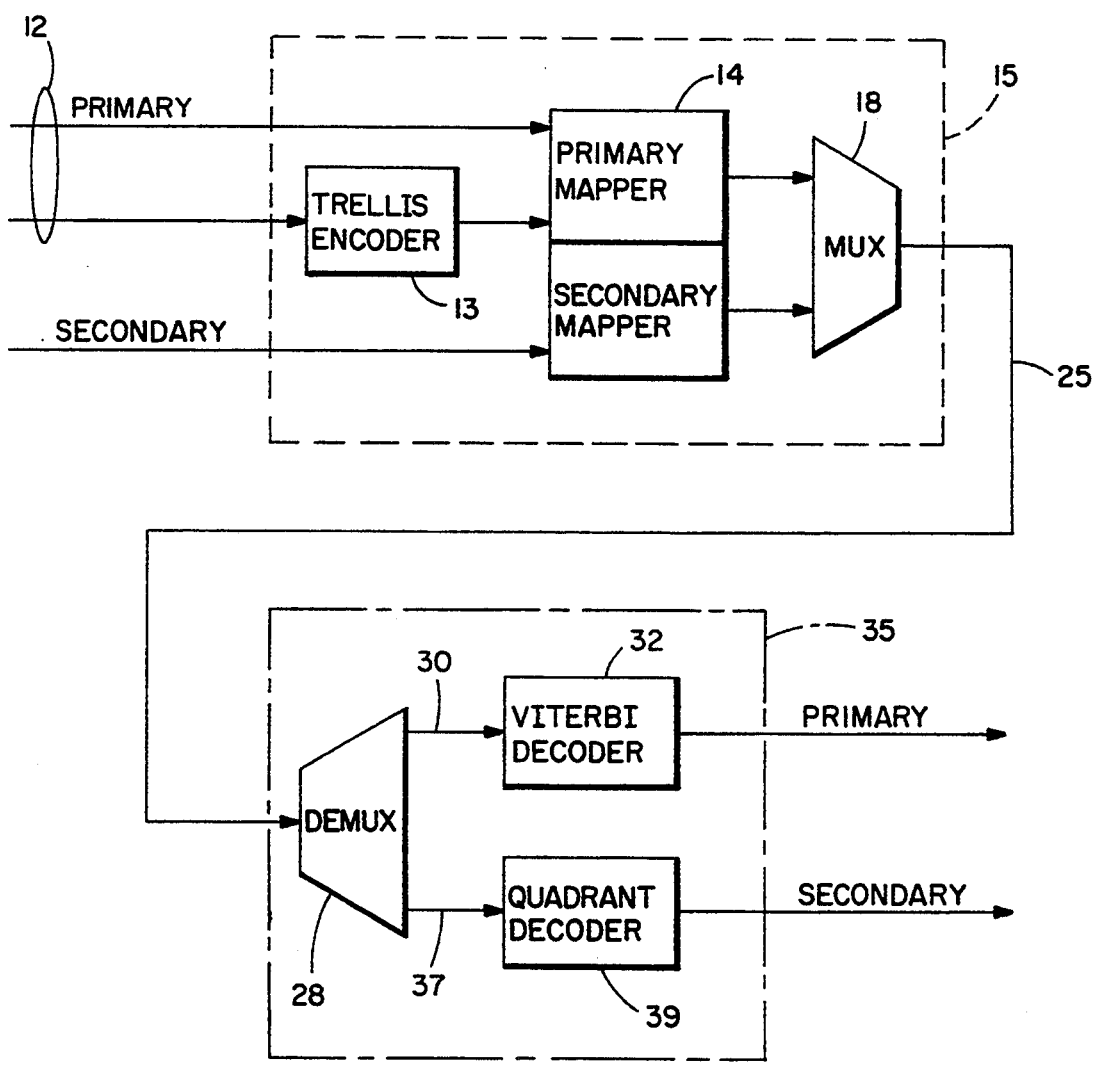
FIG. 1 is a block diagram representative of the prior art of multiplexing modem secondary channel data in with primary channel data.
Figures 2, 6:
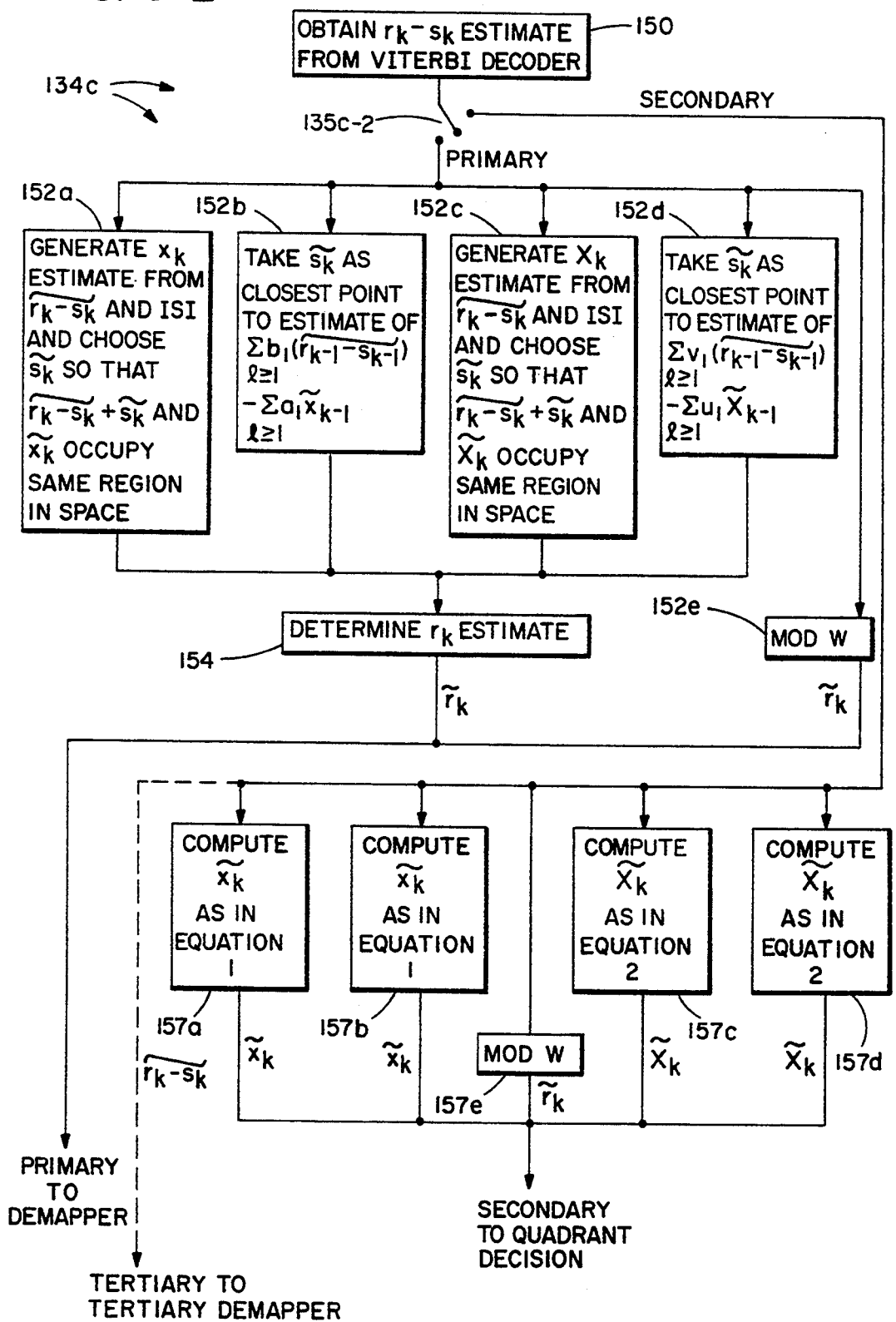

The decoders 134a and 134b of the modem receivers 130a and 130b which are used to decode the primary channel data are preferably identical and are seen in FIG. 6-1. As seen in FIG. 6-1, at step 150, the decoder 134a (134b) receives $\widetilde{r_k - s_k}$ from the Viterbi decoder 55. Then, if in the transmitter, the primary channel data were precoded according to the DPT precoding, and $s_k$ was chosen to cause $x_k$ and $r_k$ to occupy identical regions in space, then at 152a from the estimate of $r_k - s_k$, the decoder of the receiver preferably generates an estimate of $x_k$ ($\bar{x}_k$) by multiplying the received estimate by the ISI; i.e., $$\bar{x}_k + \sum_{l \geq 1} a_l \bar{x}_{k-1} = \widetilde{r_k - s_k} + \sum_{l \geq 1} b_l (\widetilde{r_{k-1} - s_{k-1}})$$

Then $\bar{s}_k$ is chosen so that $\widetilde{r_k - s_k} + \bar{s}_k$ and $\bar{x}_k$ occupy the same region in space, If, in the transmitter, the primary channel data were precoded according to DPT precoding, and $s_k$ was chosen to cause $x_k$ to approximately equal $r_k$, then at 152b, $\bar{s}_k$ is taken as the closest point to $$\sum_{l \geq 1} b_l(\widehat{r_{k-1} - s_{k-1}}) - \sum_{l \geq 1} a_l \widetilde{x}_{k-1}).$$

Where the a coefficients are taken as zero, no $\overline{X}_{k-1}$ values need be generated, However, where one or more of the $a_l$ coefficients are not zero, the $\overline{x}_{k-1}$ values are the previous estimates $\overline{x}_k$ generated as above. If, in the transmitter, the primary channel data were precoded according to the DPT precoding, and $s_k$ was chosen to cause $X_k$ and $r_k$ to occupy identical regions in space, then from the estimate of $r_k$-$s_k$, at 152c the decoder of the receiver preferably generates an estimate of $X_k$ by multiplying the received estimate by the ISI; i.e., $$\overline{X}_k + \sum_{l \geq 1} u_l \overline{X}_{k-1} = r_k \widehat{- s_k} + \sum_{l \geq 1} v_l(\widehat{r_{k-1} - s_{k-1}})$$

Then $s_k$ is chosen so that $\widehat{r_k - s_k} + \overline{s}_k$ and $\overline{X}_k$ occupy the same region in space. If, in the transmitter, the primary channel data were precoded according to the DPT precoding, and $s_k$ was chosen to cause $X_k$ to approximately equal $r_k$, then at 152d, $\overline{s}_k$ is taken as the closest point to $$\sum_{l \geq 1} v_l(\widehat{r_{k-1} - s_{k-1}}) - \sum_{l \geq 1} u_l \overline{X}_{k-1}).$$

Again, if the $u_l$ coefficients are not zero, the $\overline{X}_{k-1}$ values are previous estimates $\overline{X}_k$ as generated above. Regardless of the manner in which $\overline{s}_k$ is derived in steps 152a-152d, at step 154, from the estimate of $s_k$, the decoder 60 determines $\overline{r}_k$ according to $$\overline{r}_k = \widehat{r_k - s_k} + \overline{s}_k \tag{3}$$

Finally, with respect to FIG. 6-1, if in the transmitter, the primary channel data were precoded according to Tomlinson precoding, then at 152e, the $\widehat{r_k - s_k}$ estimate obtained from the Viterbi decoder is reduced modulo W to provide an estimate value $\overline{r}_k$. That estimate value is sent as shown in FIGS. 5a and 5b to the primary channel demapper 138 as previously discussed.

Turning to FIG. 6-2, details of the decoder 134c of modem receiver 130c are seen. Effectively, the received primary channel data are treated exactly as discussed above with reference to the decoders 134a, 134b of FIG. 6-1, and steps 150, 152a-152e, and 154 are shown identical in FIG. 6-2 and FIG. 6-1. Thus, the only difference regards the treatment of the secondary channel data. In FIG. 6-2, upon receiving the secondary channel data, switch 135c-2 (which is principally the equivalent of switch 135c of FIG. 5c) is thrown. The secondary channel data are then decoded based upon the manner in which they were originally precoded. Thus, if the secondary channel data were precoded according to the first or second DPT techniques as set forth at 107a and 107b of FIG. 4, estimates $\overline{x}_k$ are computed at 157a and 157b according to:

$$\overline{x}_k = r_k \widehat{- s_k} + \sum_{l \geq 1} b_l(\widehat{r_{k-1} - s_{k-1}}) - \sum_{l \geq 1} a_l \widetilde{x}_{k-1};$$

while if the secondary channel data were precoded according to the third or fourth DPT techniques as set forth at 107c and 107d of FIG. 4, estimates $X_k$ are computed at 157c and 157d according to:

$$\overline{X}_k = r_k \widehat{- s_k} + \sum_{l \geq 1} v_l(\widehat{r_{k-1} - s_{k-1}}) - \sum_{l \geq 1} u_l \overline{X}_{k-1}.$$

Finally, if the secondary channel data were precoded according to the Tomlinson precoding technique as set forth at 107e of FIG. 4, then at 157e, the $\widehat{r_k - s_k}$ estimate obtained from the Viterbi decoder is reduced modulo W to provide an estimate value $\overline{r}_k$. Regardless of which estimate is computed at 157a-157e, that estimate value is sent as shown in FIG. 5c to the quadrant decision means 139 where a decision is made as to in which quadrant the estimated point is found. Hence, the secondary data that was sent is recovered.

There have been described and illustrated herein transmitters and receivers which accommodate secondary channel data while maintaining trellis encoding (and Viterbi decoding), and either Tomlinson or distribution preserving Tomlinson (DPT) precoding and decoding of primary channel data. While particular embodiments have been described, it will be appreciated that it is not intended that the invention be limited thereby, as it is intended that the invention be as broad in scope as the art will allow. Thus, while the transmitters of the invention were described as preferably using certain mappers to provide coding gain, it will be appreciated that other mappers could be utilized. Also, while the 2 D secondary channel constellation points were typically taken as 2 D points which are found in the primary channel constellation, it will be appreciated that different 2 D points can be used as long as the points of the 2 D secondary channel constellation are taken from the same grid as the points of the 2 D primary channel constellation. Further, while the invention was set forth in detail for two dimensional signals based on a rectangular grid, the concepts of the invention also apply to two dimensional signals based on other grids (e.g. hexagonal) as well as to signals having three or more dimensions. Further yet, while the invention was described as requiring one point per 2 D partition element per quadrant for the 2 D secondary channel constellation, it will be appreciated that as long as the trellis encoder can provide an output regardless of its current state and the secondary channel input, then fewer points in the secondary channel constellation are required. However, by providing additional points beyond the minimum required, a tertiary channel is effectively generated, as the choice of points provides additional capacity. Moreover, by providing one point per 2 D partition element per quadrant, dependence upon the state diagram details of the trellis encoder is avoided, as at least one point is always available for use by the trellis encoder. Furthermore, with respect to the tertiary channel demapping, it is preferred that the set of $s_k$'s have the property that the 2 D partition element containing $r_k$-$s_k$ also is always the 2 D partition element containing $r_k$. Since there preferably is at most one point per 2 D partition element per quadrant, the quadrant of the estimate $\overline{r}_k$ and the 2 D partition element containing the estimate $\widehat{r_k - s_k}$ uniquely determine the estimate $\overline{r}_k$. This is the preferred tertiary channel demapping, although tertiary channel demapping can also be done in accord with the teachings of the parent applications hereto.

It will further be appreciated by those skilled in the art that the prior art transmitter arrangement of FIG. 1 can be used in conjunction with the precoder of the invention as set forth in FIG. 4 simply by taking the output of multiplexer 18 of FIG. 1 as the input to FIG. 4. A similar combination can be made in the receiver. For example, in the receiver, the primary channel trellis encoded values and the secondary channel (not trellis encoded) values are multiplexed prior to decoders 134a,b,c of FIGS. 5a-5c. The arrangements are similar to those presented in FIGS. 5a–5c, except that the secondary channel values, since they do not pass through the Viterbi decoder 132, are instead delayed by the same number of frames as the delay introduced by the Viterbi decoder 132, so that when multiplexed, the values are presented at the decoders 134a,b,c in received order. Not being trellis encoded, the secondary channel values introduced into the memory of the decoders 134a,b,c, are more corrupted than the primary channel values introduced into the memory of decoders 134a,b,c. The more corrupted values can degrade the reliability of the primary data output from the decoders 134a,b,c. To ameliorate this problem, any of several well-known techniques can be utilized to enhance the reliability of the secondary channel values prior to their introduction into the memory of the decoders 134a,b,c. For instance, the received version of a secondary point $r_k$–$s_k$ can be sliced, so that the result is in the set of points obtained by translating the 2 D secondary channel constellation by the $s_k$'s used in the precoding of the secondary channel. This technique is particularly effective when the precoding technique used for the secondary channel is Tomlinson precoding. In this case, the set of translated points consists of all 2 D points which are congruent modulo W to a point in the 2 D secondary channel constellation. Alternatively, other maximum-likelihood techniques can be utilized.

Finally, it will be appreciated that "dummy" bits were disclosed as being used to maintain the continuity of the trellis encoder, and any of numerous means can be used for generating these dummy bits. For example, the bits can be taken from a register, from ROM or RAM, or from the primary or secondary channel as copies thereof. All that is required is that the number of bits expected by the trellis encoder be provided each time the secondary channel frame is sent to the mapper. Therefore, it will be apparent to those skilled in the art that yet other changes and modifications may be made to the invention as described without departing from the scope and spirit of the invention as so claimed.

We claim:

1. A transmitter in a modem which sends at least primary channel data from a primary channel and secondary channel data from a secondary channel according to a predetermined schedule for multiplexing at least said primary channel and said secondary channel, comprising:
    a) trellis encoding means for receiving at least one first primary channel data bit from said primary channel, and for receiving at least one dummy or tertiary channel data bit from means for providing said dummy or tertiary channel data bit which is coupled to said trellis encoding means, in a time sequential order based on said predetermined schedule, and providing therefrom a coded sequence of values relating to at least said primary channel data and to said at least one dummy or tertiary channel data bit;
    b) mapper means having a primary mapper means coupled to said trellis encoding means, said primary mapper means for receiving a first portion of said coded sequence of values, said first portion of said coded sequence of values relating to said primary channel data, and said primary mapper means for receiving at least one second primary channel data bit from said primary channel, and a secondary mapper means coupled to said trellis encoder means for receiving a second portion of said coded sequence of values, said second portion of said coded sequence of values relating to said dummy or tertiary channel data bits, and said secondary mapper means for receiving a plurality of secondary channel data bits from said secondary channel, said primary and secondary mapper means for providing first and second outputs which when multiplexed together according to said predetermined schedule provide a valid coded sequence of values $\{r_k\}$ including values for said primary channel data, values for said secondary channel data, and values for said dummy or tertiary channel data.

2. A transmitter in a modem according to claim 1, further comprising: 'c) precoding means for receiving said valid coded sequence of values $\{r_k\}$ and, based on said predetermined schedule, for precoding values of said valid coded sequence of values relating to said primary channel data according to a Tomlinson precoding technique or a distribution preserving Tomlinson precoding technique, and for precoding values of said valid coded sequence of values relating to said secondary channel data according to a Tomlinson precoding technique or a distribution preserving Tomlinson precoding technique.

3. A transmitter in a modem according to claim 1, wherein:
    said primary mapper means maps said values of said coded sequence of values relating to said primary channel data and said at least one second primary channel data bit to points in a first constellation, said first constellation comprised of points in at least one two-dimensional (2 D) grid, and
    said secondary mapper means maps said values of said coded sequence of values relating to said dummy or tertiary channel data bits and said plurality of secondary channel data bits from said secondary channel to points in a second constellation, said second constellation comprised of points in said at least one 2 D grid, wherein said second constellation is different than said first constellation.

4. A transmitter in a modem according to claim 3, wherein:
    said 2 D is partitioned into a plurality of two-dimensional partition elements, and said second constellation comprises four points from each two-dimensional partition element with one point in each of four quadrants of said 2 D grid, wherein points in each of the four quadrants of said second constellation are clustered together and far from the quadrant boundaries of said four quadrants.

5. A transmitter in a modem according to claim 2, wherein:
    said primary mapper means maps said values of said coded sequence of values relating to said primary channel data and said at least one second primary channel data bit to points in a first constellation, said first constellation comprised of points in a at least one two-dimensional (2 D) grid, and
    said secondary mapper means maps said values of said coded sequence of values relating to said dummy or tertiary channel data bits and said plurality of secondary channel data bits from said secondary channel to points in a second constellation, said second constellation comprised of points in said at least one 2 D grid, wherein said second constellation is different than said first constellation.

6. A transmitter in a modem according to claim 5, wherein:

said 2 D is partitioned into a plurality of two-dimensional partition elements, and said second constellation comprises four points from each two-dimensional partition element with one point in each of four quadrants of said 2 D grid, wherein points in each of the four quadrants of said second constellation are clustered together and far from the quadrant boundaries of said four quadrants.

7. A transmitter in a modem according to claim 2, wherein:

said values of said valid coded sequence of values relating to said primary channel data are precoded according to a distribution preserving Tomlinson precoding technique, and said values of said valid coded sequence of values relating to said secondary channel data are precoded according to a Tomlinson precoding technique.

8. A transmitter in a modem according to claim 2, wherein:

said values of said valid coded sequence of values relating to said primary channel data are precoded according to a distribution preserving Tomlinson precoding technique, and said values of said valid coded sequence of values relating to said secondary channel data are precoded according to a distribution preserving Tomlinson precoding technique.

9. A transmitter in a modem according to claim 2, wherein:

said values of said valid coded sequence of values relating to said primary channel data are precoded according to a Tomlinson precoding technique, and said values of said valid coded sequence of values relating to said secondary channel data are precoded according to a Tomlinson precoding technique.

10. A receiver in a modem which receives at least primary channel data and secondary channel data according to a predetermined schedule, said primary and secondary channel data having been encoded by a modem transmitter having a trellis encoding means for receiving at least one first primary channel data bit from a primary channel, and for receiving at least one dummy or tertiary channel data bit from means for providing said dummy or tertiary channel data bit which is coupled to the trellis encoding means, in a time sequential order based on the predetermined schedule, and providing therefrom a coded sequence of values relating to at least the primary channel data and to said at least one dummy or tertiary channel data bit, a mapper means having a primary mapper means coupled to the trellis encoding means, the primary mapper means for receiving a first portion of the coded sequence of values relating to the primary channel data, and the primary mapper means for receiving at least one second primary channel data bit from the primary channel, and a secondary mapper means coupled to the trellis encoder means for receiving a second portion of the coded sequence of values relating to the dummy or tertiary channel data bits, and the secondary mapper means for receiving a plurality of secondary channel data bits from the secondary channel, the primary and secondary mapper means for providing first and second outputs which when multiplexed together according to the predetermined schedule provide a valid coded sequence of values $\{r_k\}$ including values for the primary channel data, values for the secondary channel data, and values for the dummy or tertiary channel data, said receiver comprising:

a) Viterbi decoding means for receiving a second sequence of values related to said valid coded sequence of values and for providing therefrom a third sequence of values;

b) decoder means coupled to said Viterbi decoding means for receiving said third sequence of values and providing therefrom a fourth sequence of values including values relating to said primary channel data, wherein said decoder means receives each and every value of said third sequence of values from said Viterbi decoding means;

c) demultiplexing means coupled to said decoder means for taking only said values relating to said primary channel data from said fourth sequence of values;

d) demapping means coupled to said demultiplexing means for demapping said values relating to said primary channel data taken by said demultiplexing means; and e) quadrant decision means for obtaining from said second sequence of values those values relating to said secondary channel data and for determining therefrom said secondary channel data.

* * * * *